(12) United States Patent
Park et al.

(10) Patent No.: US 10,593,482 B2
(45) Date of Patent: Mar. 17, 2020

(54) DIELECTRIC POWDER AND MULTILAYER CAPACITOR USING THE SAME

(71) Applicant: SAMSUNG ELECTRO-MECHANICS CO., LTD., Suwon-si, Gyeonggi-do (KR)

(72) Inventors: Chang Hwa Park, Suwon-si (KR); Jin Woo Kim, Suwon-si (KR); Min Gi Sin, Suwon-si (KR); Byung Hyun Park, Suwon-si (KR); Chin Mo Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 6 days.

(21) Appl. No.: 15/654,249

(22) Filed: Jul. 19, 2017

(65) Prior Publication Data
US 2018/0182557 A1 Jun. 28, 2018

(30) Foreign Application Priority Data

Dec. 28, 2016 (KR) .................. 10-2016-0180989

(51) Int. Cl.
| | |
|---|---|
| *H01G 4/30* | (2006.01) |
| *H01L 21/02* | (2006.01) |
| *H01G 4/12* | (2006.01) |
| *C01G 23/00* | (2006.01) |
| *H01L 49/02* | (2006.01) |

(Continued)

(52) U.S. Cl.
CPC .......... *H01G 4/302* (2013.01); *C01G 23/006* (2013.01); *H01G 4/1227* (2013.01); *H01L 21/02186* (2013.01); *H01L 23/291* (2013.01); *H01L 28/40* (2013.01); *C01F 11/02* (2013.01); *C01G 23/047* (2013.01); *C01P 2002/52* (2013.01);

(Continued)

(58) Field of Classification Search
CPC ..... H01L 28/40; H01L 23/291; H01G 4/1227; H01G 4/302
See application file for complete search history.

(56) References Cited

U.S. PATENT DOCUMENTS

| 4,832,939 A | * | 5/1989 | Menashi | ............... B82Y 30/00 423/265 |
| 6,548,437 B2 | * | 4/2003 | Sato | ..................... H01G 4/1227 501/137 |

(Continued)

FOREIGN PATENT DOCUMENTS

| JP | 2013-163614 A | 8/2013 |
| KR | 10-2006-0102502 A | 9/2006 |

(Continued)

OTHER PUBLICATIONS

Office Action issued in Korean Application No. 10-2016-0180989 dated Jun. 18, 2018 (with English translation).

*Primary Examiner* — Zandra V Smith
*Assistant Examiner* — John M Parker
(74) *Attorney, Agent, or Firm* — Morgan, Lewis & Bockius LLP

(57) ABSTRACT

A dielectric powder includes a core-shell structure including a core region formed in an inner portion thereof and a shell region covering the core region. The core region includes barium titanate ($BaTiO_3$) doped with a metal oxide, and the shell region is formed of a ferroelectric material.

16 Claims, 8 Drawing Sheets

(51) Int. Cl.
  *H01L 23/29* (2006.01)
  *H01G 4/10* (2006.01)
  *C01F 11/02* (2006.01)
  *C01G 23/047* (2006.01)

(52) U.S. Cl.
  CPC ...... *C01P 2004/64* (2013.01); *C01P 2004/84* (2013.01); *C01P 2004/88* (2013.01); *H01G 4/10* (2013.01)

(56) References Cited

U.S. PATENT DOCUMENTS

| | | | |
|---|---|---|---|
| 7,652,870 B2 * | 1/2010 | Yamazaki | C04B 35/4682 361/311 |
| 2001/0021095 A1 * | 9/2001 | Mizuno | C01G 23/006 361/311 |
| 2002/0016249 A1 * | 2/2002 | Saito | C04B 35/468 501/139 |
| 2006/0216512 A1 | 9/2006 | Fujikawa et al. | |
| 2011/0036268 A1 * | 2/2011 | Inoguchi | A61K 8/0241 106/287.18 |
| 2016/0039721 A1 * | 2/2016 | Fujimoto | C04B 35/62821 501/134 |
| 2016/0181017 A1 * | 6/2016 | Kamigaki | C08K 3/00 174/260 |

FOREIGN PATENT DOCUMENTS

| | | |
|---|---|---|
| KR | 10-1509878 B1 | 4/2015 |
| KR | 10-2016-0068762 A | 6/2016 |
| WO | 2015/051354 A1 | 4/2015 |

\* cited by examiner

DIELECTRIC POWDER AND MULTILAYER CAPACITOR USING THE SAME

CROSS-REFERENCE TO RELATED APPLICATION(S)

This application claims the benefit of priority to Korean Patent Application No. 10-2016-0180989, filed on Dec. 28, 2016 in the Korean Intellectual Property Office, the disclosure of which is incorporated herein by reference in its entirety.

BACKGROUND

1. Field

The present disclosure relates to a dielectric powder and a multilayer capacitor using the same.

2. Description of Related Art

A multilayer ceramic capacitor (MLCC) is an electronic component having a small size, a high capacitance, is easily mounted, and is a chip-type condenser that may be mounted on a circuit board of various electronic products, such as electronic image devices including a liquid crystal display (LCD), a plasma display panel (PDP), and the like, a computer, a personal digital assistant (PDA), a mobile phone, and the like, to charge or discharge electricity.

Recently, MLCCs have been demanded to have an ultra-small size and an ultra-high capacitance, in accordance with a trend towards the increased miniaturization and higher speed of electronic products.

In $BaTiO_3$, which is a dielectric material having a conventional perovskite structure, a dipole moment may be neutralized to increase a ratio of a cubic image in which dipole polarization is zero as atomization proceeds, such that dielectric properties are low.

Further, a product size of the multilayer capacitor is preset to have a limitation in the number of dielectric layers that can be stacked, so that there is a limitation in the possible increase in the capacitance of a multilayer capacitor with thin layers.

Therefore, in order to implement a high dielectric constant in the same, ultra small-sized product as is currently produced, it is required to implement a high dielectric constant in the dielectric material itself.

SUMMARY

An aspect of the present disclosure may provide a dielectric powder implementing a high dielectric constant, and a multilayer capacitor having a high degree of capacitance in the same size as that in the related art, by using the dielectric powder.

According to an aspect of the present disclosure, a dielectric powder may include: a core-shell structure including a core region formed in an inner portion thereof and a shell region covering the core region. The core region includes barium titanate ($BaTiO_3$) doped with a metal oxide, and the shell region is formed of a ferroelectric material.

According to another aspect of the present disclosure, a multilayer capacitor may include: a body including a plurality of dielectric layers, and first and second internal electrodes alternately disposed, with the dielectric layer interposed therebetween; and first and second external electrodes disposed to be electrically connected to exposed portions of the first and second internal electrodes in the body, respectively. The dielectric layer includes a dielectric powder having a core-shell structure including a core region formed in an inner portion thereof and a shell region covering the core region, the core region includes barium titanate ($BaTiO_3$) doped with a metal oxide, and the shell region is formed of a ferroelectric material.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, exemplary embodiments of the present disclosure will be described in detail with reference to the accompanying drawings.

Dielectric Powder

Figure 1:
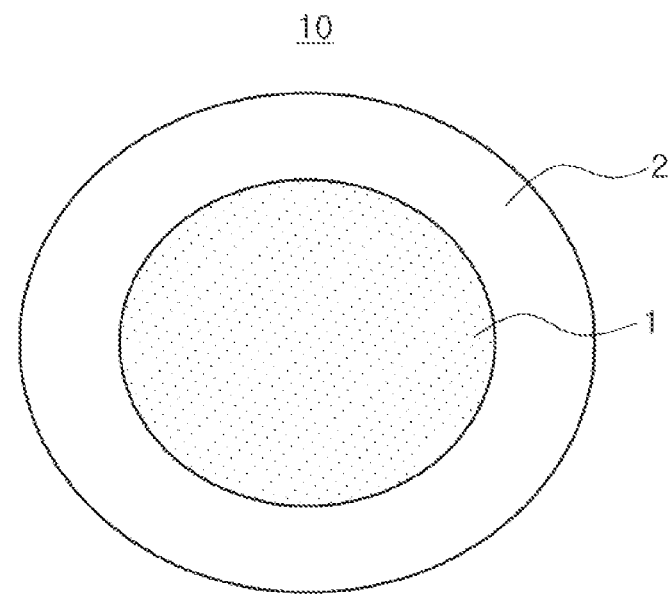
FIG. 1 is a perspective view schematically illustrating a dielectric powder according to an exemplary embodiment of the present disclosure.

FIG. 1 is a perspective view schematically illustrating a dielectric powder according to an exemplary embodiment of the present disclosure.

Referring to FIG. 1, the dielectric powder 10 according to an exemplary embodiment of the present disclosure may include a core-shell structure including a core region 1 formed in an inner portion thereof and a shell region 2 covering the core region 1.

The core region 1 is a high-conduction region, and may be formed by substituting an element having an oxidation number of 2 or 3 and an ionic radius different from that of Ba at an A site in an $ABO_3$ perovskite structure and using a large number of free electrons relative to Ba, such that the high dielectric constant may be secured.

The core region 1 may be formed, for example, by grain growth of barium titanate ($BaTiO_3$) doped with a metal oxide, such that the core region 1 may be formed of a semiconductive material of which a phase is shifted, or a conductive material.

The core region 1 may be formed by using $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)$ $O_3$, or the like, in which lanthanum (La), strontium (Sr), calcium (Ca), zirconium (Zr), and the like, are partially dissolved in $BaTiO_3$. However, the core region is not limited thereto.

The shell region 2 may serve as an insulation resistor, and may be formed of a ferroelectric material such as $BaTiO_3$.

Figure 2:
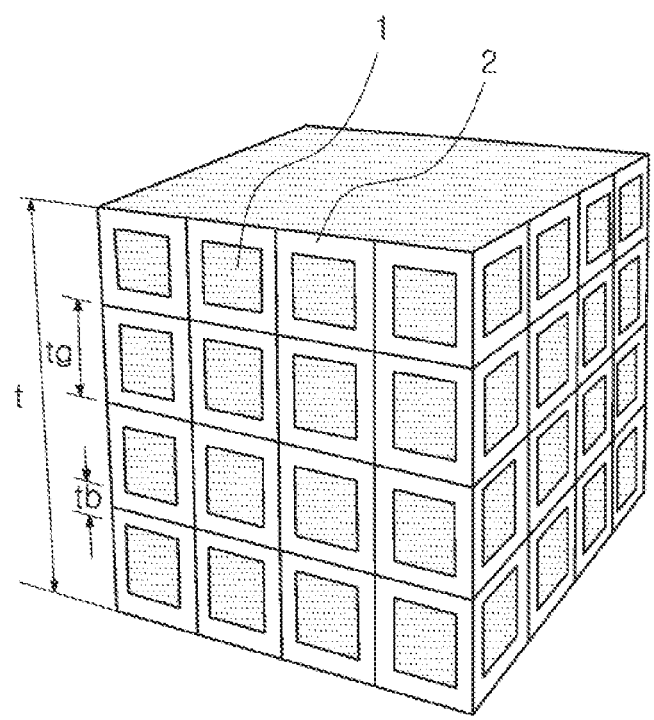
FIG. 2 is a perspective view schematically illustrating a structure after grain growth performed by firing the dielectric powder of FIG. 1.

FIG. 2 is a perspective view schematically illustrating a structure after grain growth performed by firing the dielectric powder of FIG. 1, and Equation 1 below represents a dielectric constant in a grain boundary system:

$$C = \frac{\varepsilon_r \varepsilon_0 t_g}{tt_b}\left(\varepsilon_{re} = \frac{\varepsilon_r t_g}{t_b}\right)$$ [Equation 1]

in Equation 1, C is a capacitance, $\varepsilon_r$ is a relative dielectric constant, $\varepsilon_0$ is a dielectric constant in a vacuum state, $\varepsilon_{re}$ is an actual dielectric constant relative to the relative dielectric constant, and t is a thickness of one dielectric layer. In Equation 1, a capacitance is increased as a total thickness of the dielectric layer and a thickness of the grain boundary become thinner, and as a diameter of the core becomes larger.

Referring to FIG. 2 and Equation 1 above, the dielectric powder may be formed in a block shape.

Further, as a thickness tb of the shell region 2 becomes thicker, the total dielectric constant of the dielectric powder 10 is decreased.

However, when the thickness tb of the shell region 2 is less than 10 nm, conductive elements and semi-conductive elements of the core region 1 may be diffused during firing, and a reducing action may occur, such that when the dielectric powder 10 is applied to the multilayer capacitor, to be described below, resistance and reliability of the multilayer capacitor may be deteriorated. When the thickness tb of the shell region 2 is more than 40 nm, an effect of securing the dielectric constant may be deteriorated. Therefore, in the present exemplary embodiment, the thickness tb of the shell region 2 may be 10 to 40 nm.

Further, in order to secure a high dielectric constant, a diameter of the core region 1 may be greater than or equal to the thickness tb of the shell region 2.

Here, as the diameter of the core region 1 is larger, the dielectric constant may be excellently secured. However, when the diameter thereof is more than 60 nm, it may be difficult to control the grain growth, and additives may be scattered. Thus, the diameter of the core region 1 may be 60 nm or less.

Accordingly, the dielectric powder 10 of the present exemplary embodiment may be formed of fine powder having a diameter (Tg) of 100 nm or less.

The dielectric powder 10 constituted as described above may secure a high dielectric constant by doping the metal oxide in the core region 1 to reduce a cubic phase involved in atomization, and may prevent deterioration in reliability in such aspects as IR (resistance) and temperature characteristics, and the like, by a semiconductive material, by forming a ferroelectric material in the shell region 2.

Accordingly, the dielectric constant of the dielectric powder 10, itself, may be improved, such that a high dielectric constant may be secured without involving grain growth in a non-grain growth system. The dielectric powder 10 of the present exemplary embodiment may have a dielectric constant two or more times that of the conventional powder without having the core-shell structure.

Meanwhile, when excessive grain growth occurs at the time of firing, the conductive material in the core region 1 may be diffused into the shell region 2. The dielectric powder of the present exemplary embodiment may maintain a high dielectric constant under low-temperature firing conditions in which the grain growth is suppressed, or in the non-grain growth system composition.

Figure 3:
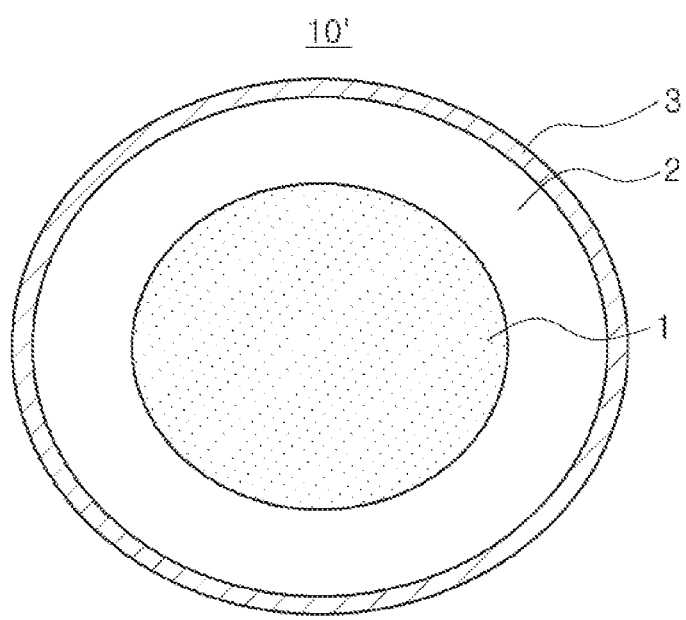
FIG. 3 is a perspective view schematically illustrating a dielectric powder according to another exemplary embodiment of the present disclosure.

FIG. 3 is a perspective view schematically illustrating a dielectric powder according to another exemplary embodiment of the present disclosure.

Referring to FIG. 3, the dielectric powder of the present exemplary embodiment may further include a coating layer 3 formed on a surface of the shell region 2.

The coating layer 3 may be formed by further doping or coating a heterogeneous element on the grain boundary of the shell region 2 and on the interface between the internal electrodes of the multilayer capacitor.

Here, the heterogeneous element is required to be non-reactive with the metal oxide doped in the core region to prevent diffusion of the heterogeneous element doped into the core region 1 and deterioration of conductivity.

For example, the heterogeneous element may be strontium (Sr), tin (Sn), dysprosium (Dy), magnesium (Mg), manganese (Mn), sodium (Na), silicon (Si), and the like, but the present disclosure is not limited thereto. That is, when Sr, Sn, Dy, Mg, Mn, Na and Si are used, insulation resistance may be effectively secured and ion diffusion in the core region may be effectively prevented. When the heterogeneous element is applied to the multilayer capacitor, additive components used in the body of the multilayer capacitor may be effectively prevented from being diffused into the core region 1.

Further, the coating layer 3 may have a thickness of 1 to 2 nm. Here, when the thickness of the coating layer 3 is more than 2 nm, the coating layers of respective powders may aggregate with each other, and fail to maintain a film shape, and thereby form an island shape. When the thickness of the coating layer 3 is less than 1 nm, the film shape may not be stably maintained and, rather, sintering property may be deteriorated at the time of firing.

The coating layer 3 may be formed by reacting a monomolecular adsorbent including an atomic alkali metal with an additive of nitrate or hydrochloride.

Here, the monomolecular adsorbent may be, for example, a molecular electrolyte or a ketone-based electrolyte, and the alkali metal may be an alkali metal having an atomic number of 20, and, for example, may be at least one of sodium (Na), potassium (K) or lithium (Li).

In addition, the total thicknesses of the coating layer 3 and the shell region 2 may preferably not be more than 40 nm.

Method of Preparing Dielectric Powder

Hereinafter, a method of preparing a dielectric powder according to an exemplary embodiment of the present disclosure is described.

Figure 4:
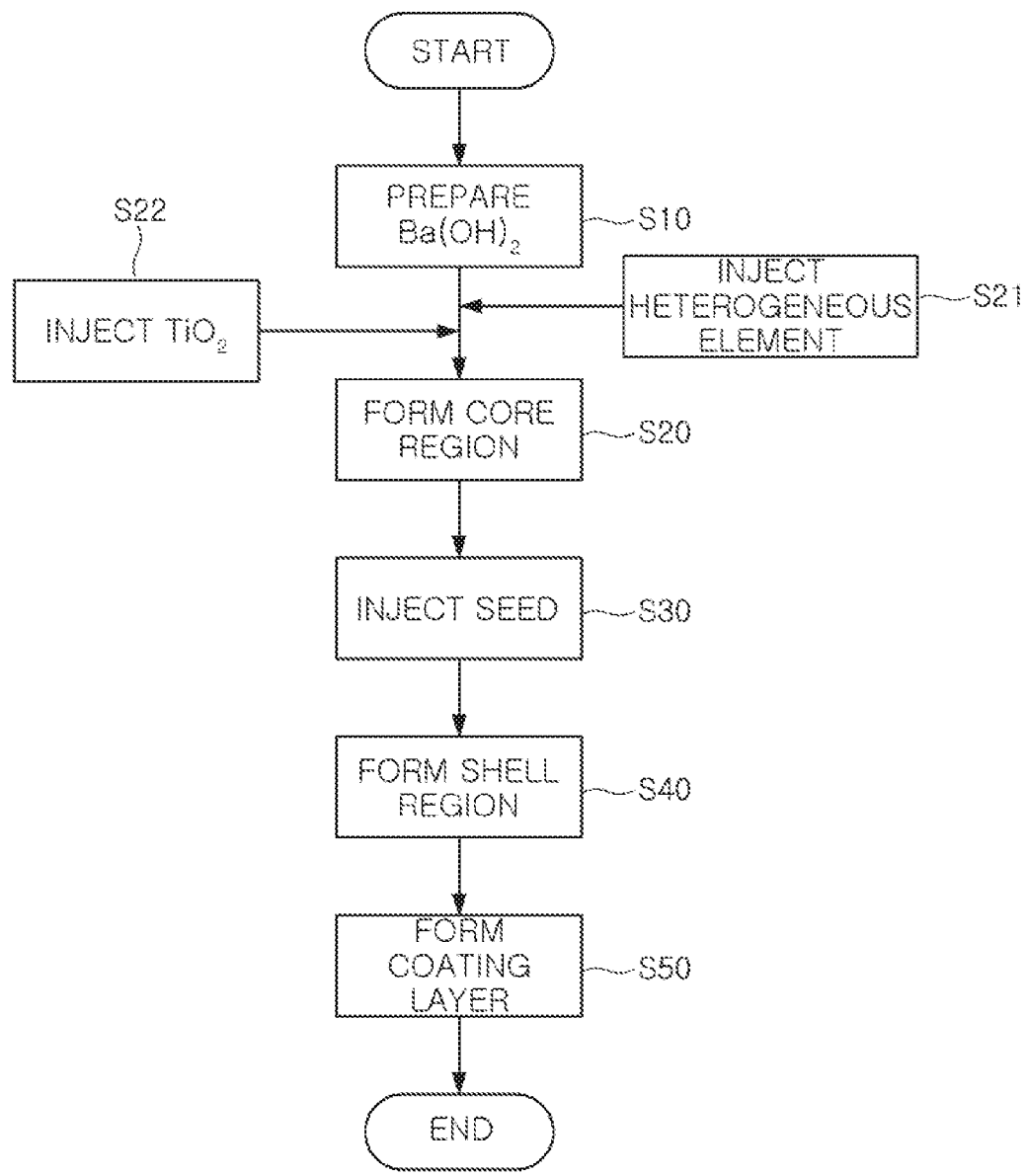
FIG. 4 is a flowchart sequentially illustrating a method of preparing a dielectric powder according to an exemplary embodiment of the present disclosure.

Referring to FIG. 4, Ba $(OH)_2$ may first be prepared (S10), a heterogeneous element and $TiO_2$ may be injected into the Ba $(OH)_2$ (S21 and S22), followed by substitution and doping to form a core region of 60 nm or less (S20).

Figure 5:
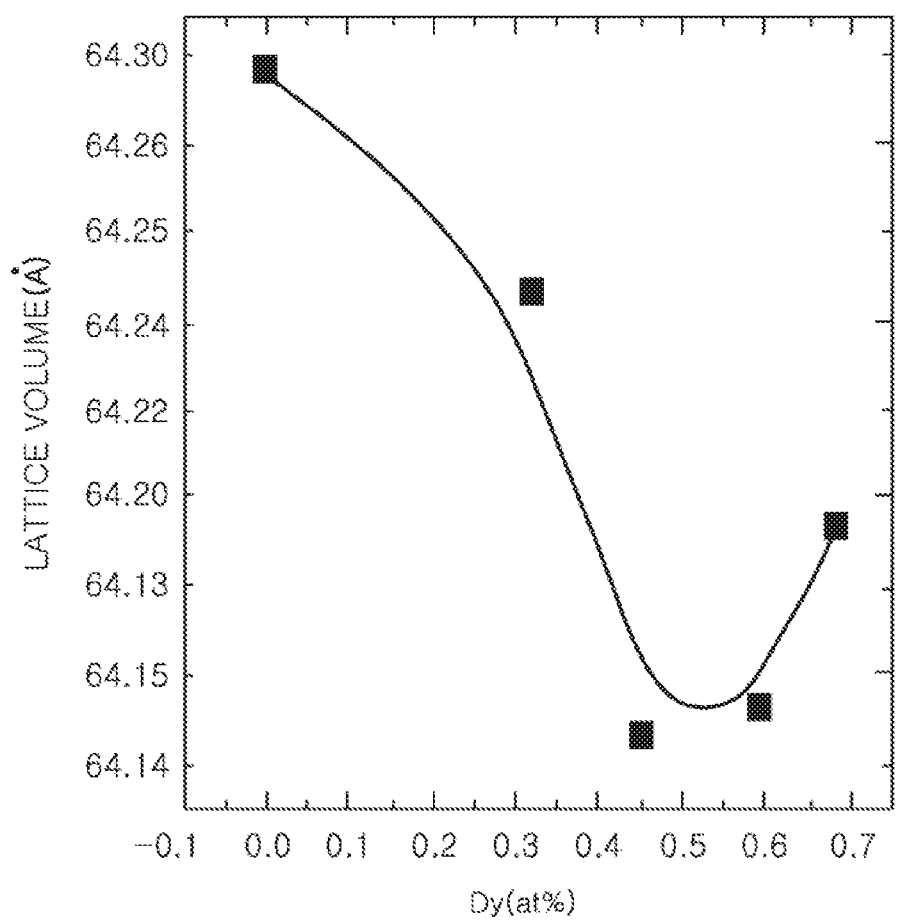
FIG. 5 is a graph illustrating a change in a lattice structure of the dielectric powder according to a content of Dy in a core region.

The heterogeneous element may be an alkali-soluble metal oxide, and may include at least one or more metal ions such as Dy, Ce, Al, La, Bi, Cu, and the like. For example, referring to FIG. 5, it may be confirmed that when Dy is used as the heterogeneous element, Dy may be precipitated in a secondary phase through a change in lattice volume.

Here, limited solubilities of the heterogeneous elements may be different from each other, and the limited solubility may vary according to a BET, a grain growth temperature, a content of $Ba(OH)_2$ in the grain growth, and electrical conductivity.

Further, the content of the heterogeneous element may be 0.1 to 2.0 mol % based on $TiO_2$, and the content thereof may vary according to a target size of the core region.

Next, a 10 nm-sized seed may be injected (S30), followed by grain growth, to forma shell region around the core region (S40). The seed may be a $BaTiO_3$-based seed.

Here, a volume fraction of the core region and the shell region may be adjusted at a ratio of 1:1 to 10:1, and the shell region may be formed to have a thickness of 10 to 40 nm.

Then, if necessary, properties of the dielectric powder may be further improved by further forming a coating layer on the surface of the shell region (S50).

The coating layer may be formed by doping or coating the heterogeneous element on the grain boundary of the shell region or on the interface between the internal electrodes of the multilayer capacitor.

The heterogeneous element may be limited to being non-reactive, with the metal oxide doped in the core region, such that diffusion of the doped heterogeneous element in the core region and deterioration of conductivity may be prevented.

For example, the heterogeneous element may include at least one or more of Sr, Sn, Dy, Mg, Mn, Na, Si, and the like, but the present disclosure is not limited thereto.

Next, a drying process may be performed to complete the dielectric powder.

Multilayer Capacitor

Figure 6:
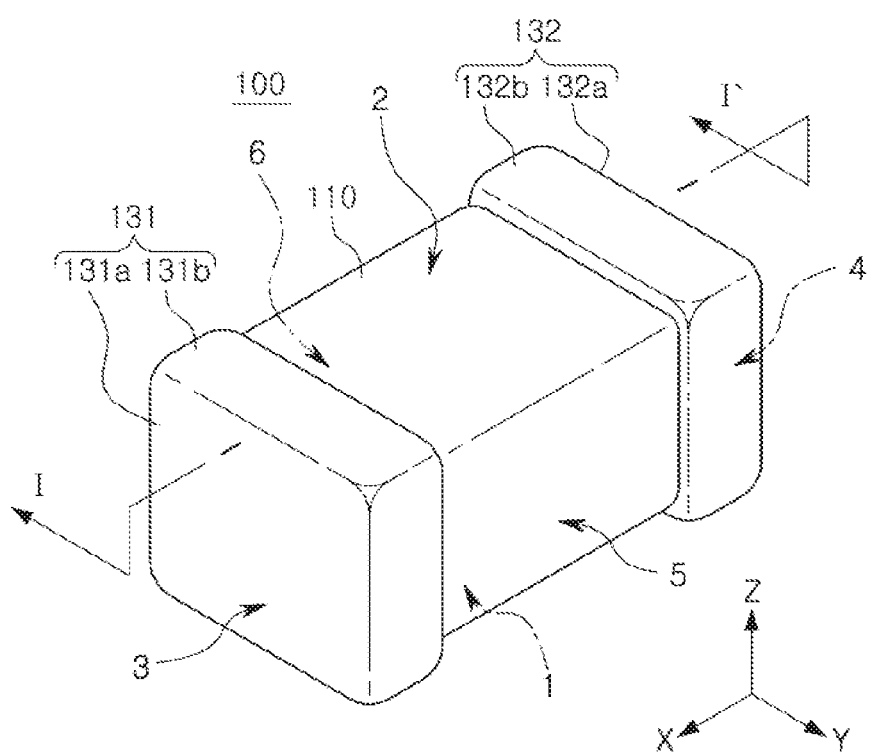
FIG. 6 is a perspective view illustrating a schematic structure of a multilayer capacitor according to an exemplary embodiment of the present disclosure.
Figure 7:
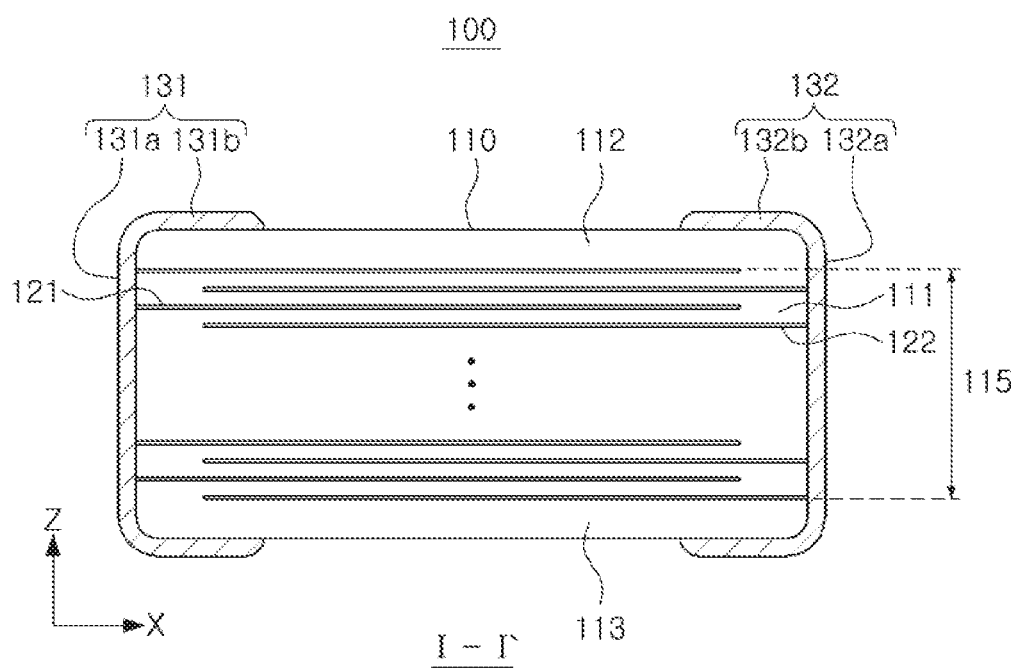
FIG. 7 is a cross-sectional view taken along line I-I' of FIG. 6.
Figure 8:
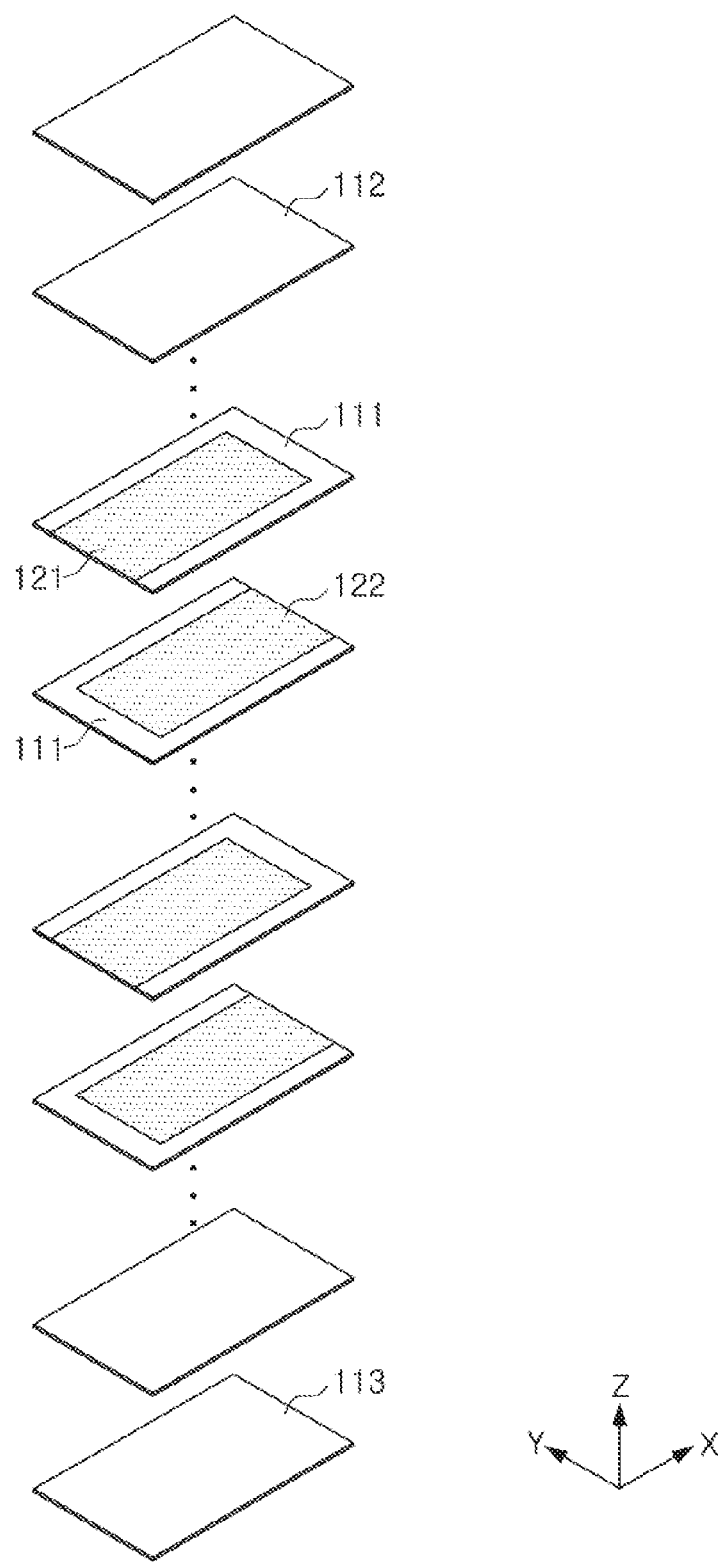
FIG. 8 is an exploded perspective view illustrating a stacked structure of internal electrodes in FIG. 6.

Referring to FIGS. 6 to 8, a multilayer capacitor 100 according to an exemplary embodiment of the present disclosure may include a body 110 and first and second external electrodes 131 and 132.

Directions in the body 110 will be defined in order to clearly describe the present exemplary embodiment of the present disclosure. X, Y and Z marked on the drawings refer to a length direction, a width direction, and a thickness direction, respectively.

Here, the thickness direction may be used with the same meaning as a direction in which dielectric layers 111 are stacked.

In addition, the body 110 is not particularly limited with respect to shape, and, for example, may have a hexahedral shape.

In the present exemplary embodiment, for convenience of explanation, both surfaces opposing each other in the Z direction, in which the dielectric layers 111 of the body 110 are stacked, refer to first and second surfaces 1 and 2, both surfaces connecting the first and second surfaces 1 and 2 and opposing each other in the X direction refer to third and fourth surfaces 3 and 4, and both surfaces vertically intersecting with the third and fourth surfaces and opposing each other in the Y direction refer to fifth and sixth surfaces 5 and 6.

The body 110 may include an active region 115 and upper and lower covers 112 and 113, which are margin parts.

The active region 115 is a portion which contributes to capacitance formation of the capacitor, and may be formed by alternately stacking the plurality of dielectric layers 111 and the first and second internal electrodes 121 and 122, with the dielectric layer 111 interposed therebetween in the Z direction.

In the drawings, the upper cover 112 is a portion formed, at a predetermined thickness, on the upper surface of the first internal electrode 121 disposed in an uppermost portion in the active region 115, and the lower cover 113 is a portion formed, at a predetermined thickness, on the lower surface of the second internal electrode 122 disposed in a lowermost portion in the active region 115.

The upper cover 112 and the lower cover 113 may be formed by stacking at least one or more dielectric layers 111 included in the active region 115 on the upper and lower surfaces of the active region 115.

The dielectric layers 111 may include the dielectric powder according to the exemplary embodiment as described above, may be in a sintered state, and may be integrated so as to be difficult to confirm a boundary therebetween without using a scanning electron microscope (SEM).

Since the dielectric powders of the dielectric layer 111 are prepared to have different sizes, voids may occur between the respective dielectric powders when stacked vertically.

Accordingly, the dielectric layer 111 may further include a glass to remove the voids and to adjust a height of the dielectric powders according to a design, when the dielectric powders are stacked.

The first and second internal electrodes 121 and 122, which are electrodes having different polarities, may be disposed to face each other in a direction in which the dielectric layers 111 are stacked, and may be electrically insulated from each other by the dielectric layers 111 disposed therebetween.

One end portions of the first and second internal electrodes 121 and 122 may be exposed through the third and fourth surfaces 3 and 4 of the body 110, respectively.

In addition, the end portions of the first and second internal electrodes 121 and 122, exposed through the first and second surfaces 3 and 4 of the body 110, may be electrically connected to the first and second external electrodes 131 and 132, respectively, on the third and fourth surfaces 3 and 4 of the body 110.

When predetermined voltages are applied to the first and second external electrodes 131 and 132, electric charges may be accumulated between the first and second internal electrodes 121 and 122 facing each other. Here, a capacitance of the multilayer capacitor 100 may be in proportion to an overlap area in which the first and second internal electrodes 121 and 122 overlap one another.

The first and second internal electrodes 121 and 122 may be formed of a conductive material, for example, a material such as nickel, a nickel alloy, or the like. However, the present disclosure is not limited thereto.

Further, a method of printing the conductive metal may include a screen printing method, a gravure printing method, or the like, but the present disclosure is not limited thereto.

The first and second external electrodes 131 and 132 may include first and second connection parts 131a and 132a and first and second band parts 131b and 132b, respectively.

The first and second connection parts 131a and 132a may be disposed on the third and fourth surfaces 3 and 4 of the body 110, respectively, and may be contacting and electrically connected to the exposed portions of the first and second internal electrodes 121 and 122, respectively.

The first and second band parts 131b and 132b may be extended from the first and second connection parts 131a and 132a to a portion of the first and second surfaces 1 and 2 and a portion of the fifth and sixth surfaces 5 and 6 of the body 11, respectively, and may improve adhesion strength of the body 110.

The first and second external electrodes 131 and 132 may be formed by a conductive paste containing a conductive metal.

The conductive metal may be nickel (Ni), copper (Cu), palladium (Pd), gold (Au), or alloys thereof, but the present disclosure is not limited thereto.

Plating layers (not shown) may be further formed on surfaces of the first and second external electrodes 131 and 132 using nickel (Ni), tin (Sn), or the like.

In the multilayer capacitor of the present exemplary embodiment constituted as described above, the dielectric powder of the dielectric layer may include the core region with high conductivity and the shell region with semiconductivity, thereby securing a dielectric constant of the multilayer capacitor.

In addition, since the dielectric layer constituting the body has the core-shell structure, excessive diffusion of additive components may be suppressed, and the shell region may form interface layers at the grain boundary region and the interface between the internal electrode and the dielectric layer, such that reliability characteristics such as insulation resistance, and the like, and a withstand voltage characteristic, may be improved.

In addition, in the multilayer capacitor of the present exemplary embodiment, since the dielectric powder of the dielectric layer constituting the body may have a block-type structure, to be fired in a state of a mutual surface contact rather than a mutual point contact, a firing speed may be increased at the time of manufacturing the capacitor.

The mutual surface contact between the dielectric powders functions to suppress the additives used at the time of manufacturing the dielectric layer from being diffused throughout the grain. Thus, the dielectric constant of the core region may be increased, to further increase the dielectric constant of the dielectric powder, such that the dielectric constant of the multilayer capacitor may be further increased.

The conventional dielectric layer may be manufactured by mixing spherical $BaTiO_3$ as a base material and amorphous metal oxide powder as an additive, uniformly dispersing the mixture using an organic solvent as a solvent, followed by molding into a sheet form, and drying.

However, since the dielectric layer has excessive grain growth caused by high activation energy of the metal oxide powder used as the additive, reliability is deteriorated, such that firing under low speed and high temperature conditions may be performed. However, there is a problem in firing under high speed and low temperature conditions or in firing in a thin-layered state.

A technique in which a metal oxide powder used as an additive is formed of a nano-metal oxide having a size of 20 nm or less, or where the additive is coated on a surface of $BaTiO_3$, is disclosed to solve the above-described problem.

However, in the above-described nano-metal oxide, a firing effect under the high speed and low temperature conditions or a firing effect in a thin-layered state are not high due to the limitation of fine dispersion.

Further, in the case of the technique of coating the additive on the surface of $BaTiO_3$, the occurrence of excessive grain growth may be partially suppressed. However, a long period of time for firing may still be required, due to geometric properties showing sintering property due to point contact between grains.

According to another exemplary embodiment of the present disclosure, the dielectric powder forming the dielectric layer may have the core-shell structure, and the coating layer may be formed on the surface of the shell region, such that the additive such as nitrate, hydrochloride, or the like, rapidly reacts with the base material but, generally, only partially reacts in the shell region, thereby significantly reducing full diffusion into the core region, and thus the firing under high speed and low temperature conditions may be performed.

Therefore, when the dielectric layer and the body of the capacitor are formed of the materials described above, a dielectric constant and high reliability of the multilayer capacitor may be further improved.

Figure 9:
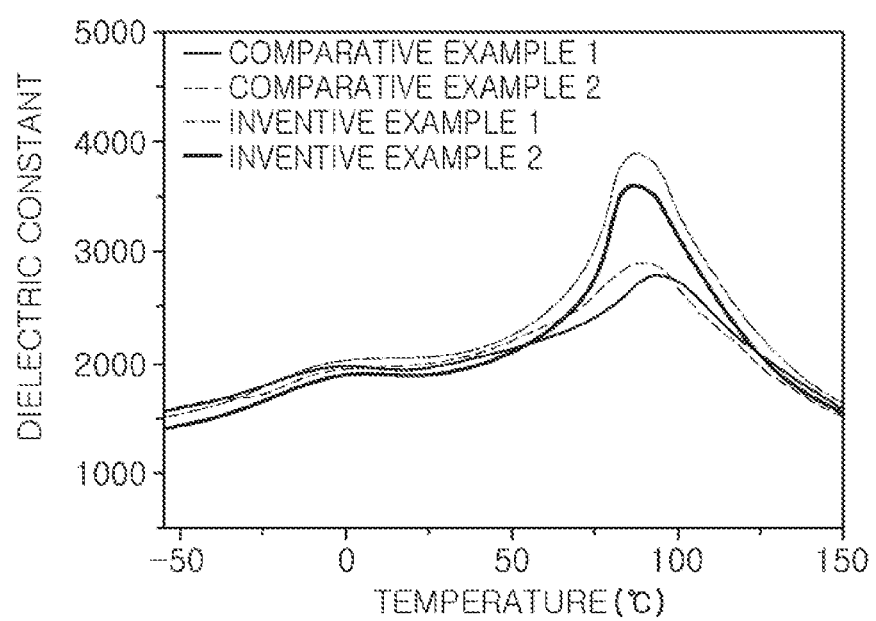
FIG. 9 is a graph illustrating thermal characteristics of the multilayer capacitors according to characteristics of the dielectric powders, respectively.

FIG. 9 is a graph illustrating thermal characteristics of the multilayer capacitors according to characteristics of the dielectric powders, respectively.

Here, Comparative Example 1 indicates room temperature dielectric constants per temperature of a multilayer capacitor, in which the conventional 50 nm-sized BT powder is applied to the dielectric layer of the body, and Comparative Example 2 indicates room temperature dielectric constants per temperature of a multilayer capacitor in which the conventional 70 nm-sized BT powder is applied to the dielectric layer of the body.

Further, Inventive Example 1 indicates room temperature dielectric constants per temperature of a multilayer capacitor in which the dielectric powder synthesized at 180° C. by the exemplary embodiment of the present disclosure is applied to the dielectric layer of the body, and Inventive Example 2 indicates room temperature dielectric constants per temperature of a multilayer capacitor in which the dielectric powder synthesized at 220° C. by the exemplary embodiment of the present disclosure is applied to the dielectric layer of the body.

In the present experimental example, a diffusion temperature of the heterogeneous element was determined on the basis of about 200° C., such that synthesis temperatures of Inventive Examples 1 and 2 were set in consideration of the determination.

In addition, respective samples were evaluated by stacking 30 layered dielectrics and 30 layered internal electrodes to manufacture multilayer capacitors having a 1608 size, respectively, and the firing was performed by rapidly raising a temperature to 1120° C. at a weak reducing atmosphere of 1% hydrogen gas.

As results of the evaluation, it could be confirmed that Inventive Example 2, using the dielectric powder of the exemplary embodiment of the present disclosure, showed a maximum value of the dielectric constant, which was increased by about 25% over that of Comparative Example 1, and Inventive Example 1, in which the synthesis temperature of the powder was 200° C. or more, showed the maximum value of the dielectric constant to have increased by about 5%, as compared to that of Example 2.

Meanwhile, when the dielectric powder did not have the shell region formed therein, even though the heterogeneous element was doped in the core region, the dielectric constant thereof was lowered as compared to that of the dielectric powder having the core-shell structure.

As set forth above, according to the exemplary embodiments in the present disclosure, the dielectric powder having a high dielectric constant and high reliability may be provided by forming the core region through grain growth of barium titanate ($BaTiO_3$) doped with a metal oxide, and forming the shell region with the ferroelectric material, and the capacitance and reliability of the multilayer capacitor in the same size may be improved by using the dielectric powder.

While the present invention has been shown and described in connection with the embodiments, it will be apparent to those skilled in the art that modifications and variations can be made without departing from the spirit and scope of the invention, as defined by the appended claims.

What is claimed is:

1. A dielectric powder comprising a core-shell structure including a core region formed in an inner portion thereof and a shell region covering the core region,
wherein the core region includes barium titanate ($BaTiO_3$) doped with a metal oxide, wherein the metal oxide comprises at least one selected from the group consisting of Dy, Ce, Al, La, Bi and Cu, and
the shell region is formed of a ferroelectric material.

2. The dielectric powder of claim 1, further comprising:
a coating layer including a heterogeneous element and covering a surface of the shell region,
wherein the heterogeneous element includes at least one of Sr, Sn, Dy, Mg, Mn, Na, and Si.

3. The dielectric powder of claim 2, wherein the coating layer has a thickness within a range of 1 to 2 nm.

4. The dielectric powder of claim 2, wherein the coating layer is formed by reacting a monomolecular adsorbent including an alkali metal comprising at least one selected from the group consisting of sodium (Na), potassium (K) and lithium (Li).

5. The dielectric powder of claim 1, wherein the core region has a diameter larger than a thickness of the shell region.

6. The dielectric powder of claim 1, wherein the core region has a diameter of 60 nm or less, and the shell region has a thickness within a range of 10 to 40 nm.

7. The dielectric powder of claim 1, wherein a total diameter of the core region and the shell region is 100 nm or less.

8. The dielectric powder of claim 1, wherein the core region is formed by grain growth of the barium titanate ($BaTiO_3$) doped with the metal oxide.

9. The dielectric powder of claim 1, wherein the core region further includes at least one of lanthanum (La), strontium (Sr), or calcium (Ca).

10. The dielectric powder of claim 1, wherein the core-shell structure is configured in a block shape.

11. The dielectric powder of claim 1, wherein a content of the metal oxide included in the core region is 0.1 to 2.0 mol % based on $TiO_2$ added to the core region.

12. A multilayer capacitor comprising:
a body including a plurality of dielectric layers and first and second internal electrodes alternately disposed with the dielectric layer interposed therebetween; and
first and second external electrodes disposed to be electrically connected to exposed portions of the first and second internal electrodes in the body, respectively;
wherein the dielectric layer includes a dielectric powder having a core-shell structure including a core region formed in an inner portion thereof and a shell region covering the core region,
the core region includes barium titanate ($BaTiO_3$) doped with a metal oxide, wherein the metal oxide comprises at least one selected from the group consisting of Dy, Ce, Al, La, Bi and Cu, and
the shell region is formed of a ferroelectric material.

13. The multilayer capacitor of claim 12, wherein the dielectric powder further includes a coating layer including a heterogeneous element and covering a surface of the shell region, and the heterogeneous element includes at least one of Sr, Mn, or Na.

14. The multilayer capacitor of claim 12, wherein, in the dielectric powder, the core region has a diameter larger than a thickness of the shell region.

15. The multilayer capacitor of claim 12, wherein, in the dielectric powder, the core region has a diameter of 60 nm or less, and the shell region has a thickness within a range of 10 to 40 nm.

16. The multilayer capacitor of claim 12, wherein in the dielectric powder, a total diameter of the core region and the shell region is 100 nm or less.

* * * * *